United States Patent
Mao et al.

(10) Patent No.: US 7,510,964 B2
(45) Date of Patent: Mar. 31, 2009

(54) METHOD FOR MANUFACTURING SEMICONDUCTOR DEVICE THAT INCLUDES BAKING A DIELECTRIC LAYER AFTER EXPOSURE TO PLASMA

(75) Inventors: Chih-Jen Mao, Tainan County (TW); Kuo-Wei Yang, Hsinchu (TW); Hui-Shen Shih, Changhua Hsien (TW); Chun-Han Chuang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 398 days.

(21) Appl. No.: 11/307,165

(22) Filed: Jan. 26, 2006

(65) Prior Publication Data
US 2007/0173065 A1 Jul. 26, 2007

(51) Int. Cl.
*H01L 21/477* (2006.01)

(52) U.S. Cl. .............. 438/637; 438/715; 438/782; 257/E21.471

(58) Field of Classification Search .............. 438/715, 438/716; 257/E21.471
See application file for complete search history.

(56) References Cited

U.S. PATENT DOCUMENTS

| | | | |
|---|---|---|---|
| 4,516,145 A * | 5/1985 | Chang et al. ............ | 257/369 |
| 6,835,607 B2 * | 12/2004 | Takemura et al. ........ | 438/163 |
| 2002/0137295 A1 * | 9/2002 | Thei et al. .............. | 438/296 |
| 2004/0259384 A1 * | 12/2004 | Nag et al. ............... | 438/788 |

* cited by examiner

Primary Examiner—Stephen W Smoot
(74) Attorney, Agent, or Firm—Jiang Chyun IP Office

(57) ABSTRACT

The invention is directed to a method for manufacturing semiconductor device. The method comprises steps of providing a substrate and then forming a dielectric material-containing device over the substrate. A plasma vapor deposition process is performed to form a dielectric layer over the substrate. A first baking process is performed.

27 Claims, 4 Drawing Sheets

METHOD FOR MANUFACTURING SEMICONDUCTOR DEVICE THAT INCLUDES BAKING A DIELECTRIC LAYER AFTER EXPOSURE TO PLASMA

BACKGROUND OF THE INVENTION

1. Field of Invention

The present invention relates to a method for manufacturing an integrated circuit. More particularly, the present invention relates to a method for manufacturing a semiconductor device.

2. Description of Related Art

In the process for manufacturing a semiconductor device, with the increasing of the integration of the devices, the area provided by a single wafer is not enough for forming the necessary interconnects. Currently, in order to full fill the demands for the increasing of the interconnects while the size of the transistor is decreased, the interconnects is composed of more than two metal layers.

In the interconnects, the inter-layer dielectric layer and the inter-metal dielectric layer between two metal layers are made by performing a low temperature process, such as the plasma enhanced chemical vapor deposition or the high density plasma chemical vapor deposition. Nevertheless, once the plasma process for forming the dielectric layer is interrupted, the particles accumulate on the dielectric layer to affect the electric property of the semiconductor device. Hence, the yield and the reliability of the semiconductor device is decreased.

SUMMARY OF THE INVENTION

Accordingly, at least one objective of the present invention is to provide a method for manufacturing a semiconductor device capable of decreasing the impact on the electrical performance of the thin film layer caused by abnormally interrupting the plasma process.

At least another objective of the present invention is to provide a method for manufacturing a semiconductor device to increase the yield and the reliability of the device.

To achieve these and other advantages and in accordance with the purpose of the invention, as embodied and broadly described herein, the invention provides a method for manufacturing semiconductor device. The method comprises steps of providing a substrate and then forming a dielectric material-containing device over the substrate. A plasma vapor deposition process is performed to form a dielectric layer over the substrate. A first baking process is performed.

According to one embodiment of the present invention, the aforementioned dielectric material-containing device is selected from a group consisting of a metal-oxide semiconductor, an SONOS memory, a flash memory and a capacitor.

According to one embodiment of the present invention, the aforementioned dielectric layer is an inter-layer dielectric layer or an inter-metal dielectric layer.

According to one embodiment of the present invention, the aforementioned plasma vapor deposition process is selected from a group consisting of a plasma enhanced chemical vapor deposition process and a high density plasma chemical vapor deposition.

According to one embodiment of the present invention, the aforementioned first baking process is performed after the plasma vapor deposition process is interrupted.

According to one embodiment of the present invention, when the first baking process is performed after the plasma vapor deposition process is interrupted, the aforementioned method further comprises a step of performing a second baking process after the plasma vapor deposition process is accomplished.

According to one embodiment of the present invention, the aforementioned first baking process is performed right after the plasma vapor deposition process is performed.

According to one embodiment of the present invention, a gas used in the aforementioned first baking process is selected from a group consisting of inert gas, nitrogen, oxygen and $N_2O$.

According to one embodiment of the present invention, the aforementioned inert gas is selected from a group consisting helium, neon, krypton, xenon and radon.

According to one embodiment of the present invention, the aforementioned first baking process is performed under a temperature of about 380~450 centigrade.

According to one embodiment of the present invention, the aforementioned first baking process is performed for about 1~20 minutes.

The present invention also provides a method for manufacturing a semiconductor device. The method comprises steps of providing a substrate and then forming a dielectric material-containing device over the substrate. A dielectric layer is formed over the substrate. A plasma etching process is performed to pattern the dielectric layer to form an opening in the dielectric layer. A first baking process is performed.

According to one embodiment of the present invention, the aforementioned dielectric material-containing device is selected from a group consisting of a metal-oxide semiconductor, an SONOS memory, a flash memory and a capacitor.

According to one embodiment of the present invention, the aforementioned first baking process is performed after the plasma etching process is interrupted.

According to one embodiment of the present invention, when the first baking process is performed after the plasma etching process is interrupted, the method further comprises a step of performing a second baking process after the aforementioned plasma etching process is accomplished.

According to one embodiment of the present invention, the aforementioned first baking process is performed right after the plasma etching process is performed.

According to one embodiment of the present invention, a gas used in the aforementioned first baking process is selected from a group consisting of inert gas, nitrogen, oxygen and $N_2O$.

According to one embodiment of the present invention, the aforementioned inert gas is selected from a group consisting helium, neon, krypton, xenon and radon.

According to one embodiment of the present invention, the aforementioned first baking process is performed under a temperature of about 380~450 centigrade.

According to one embodiment of the present invention, the aforementioned first baking process is performed for about 1~20 minutes.

According to one embodiment of the present invention, the aforementioned opening is selected from a group consisting of a contact window opening, a via opening, a trench and a capacitor opening.

According to one embodiment of the present invention, the aforementioned dielectric layer is an inter-layer dielectric layer or an inter-metal dielectric layer.

According to one embodiment of the present invention, the aforementioned dielectric layer is formed by performing a plasma vapor deposition process.

According to one embodiment of the present invention, the aforementioned plasma vapor deposition process is selected from a group consisting of a plasma enhanced chemical vapor deposition process and a high density plasma chemical vapor deposition.

According to one embodiment of the present invention, when the dielectric layer is formed by performing a plasma vapor deposition process, the aforementioned method further comprises a step of performing a third baking process after the dielectric layer is formed.

According to one embodiment of the present invention, the aforementioned third baking process is performed right after the plasma vapor deposition process is performed.

According to one embodiment of the present invention, the aforementioned third baking process is performed after the plasma vapor deposition process is interrupted.

According to one embodiment of the present invention, the aforementioned third baking process is performed under a temperature of about 380~450 centigrade.

According to one embodiment of the present invention, the aforementioned third baking process is performed for about 1~20 minutes.

In the method according to the present invention, since a baking process is performed after the plasma process, such as the plasma deposition process or the plasma etching process, is suddenly interrupted, the ions and particles accumulated in the dielectric layer can be fled. Hence, the surface voltage of the dielectric layer is decreased to increase the yield and the reliability of the device. The baking process in the present invention not only can be used as a remedy process for the interruption of the plasma process but also can be brought into the standard manufacturing process to improve the dielectric property of the dielectric material layer so as to increase the yield of the device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
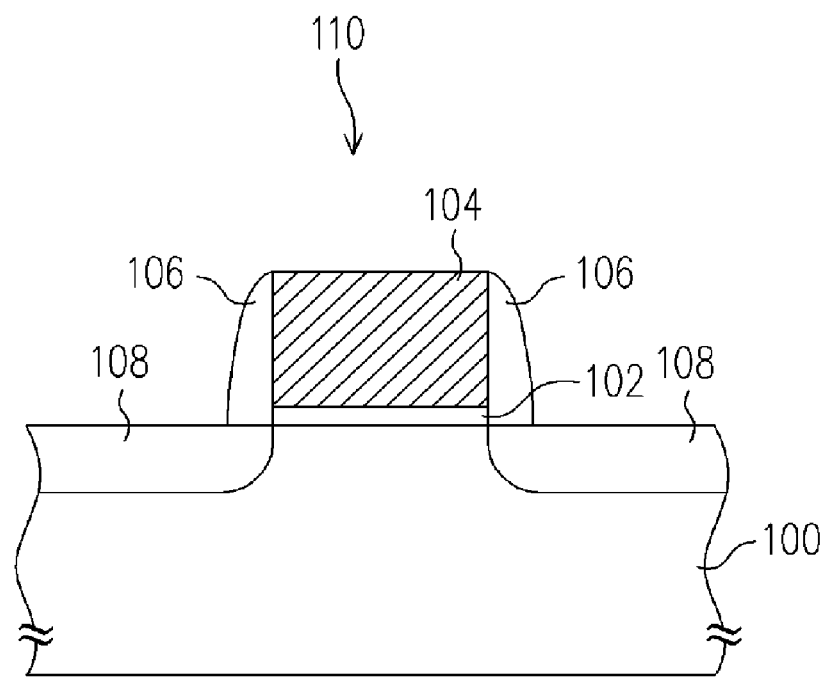
FIGS. 1A through 1C are cross-sectional views illustrating a method for manufacturing a semiconductor device according to a preferred embodiment of the invention.
Figure 1B:
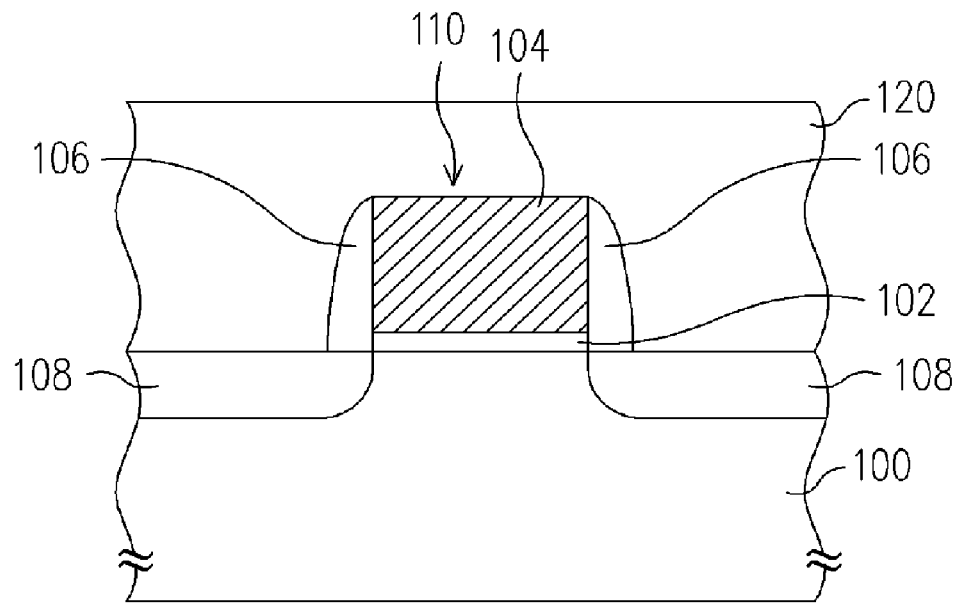
Figure 1C:
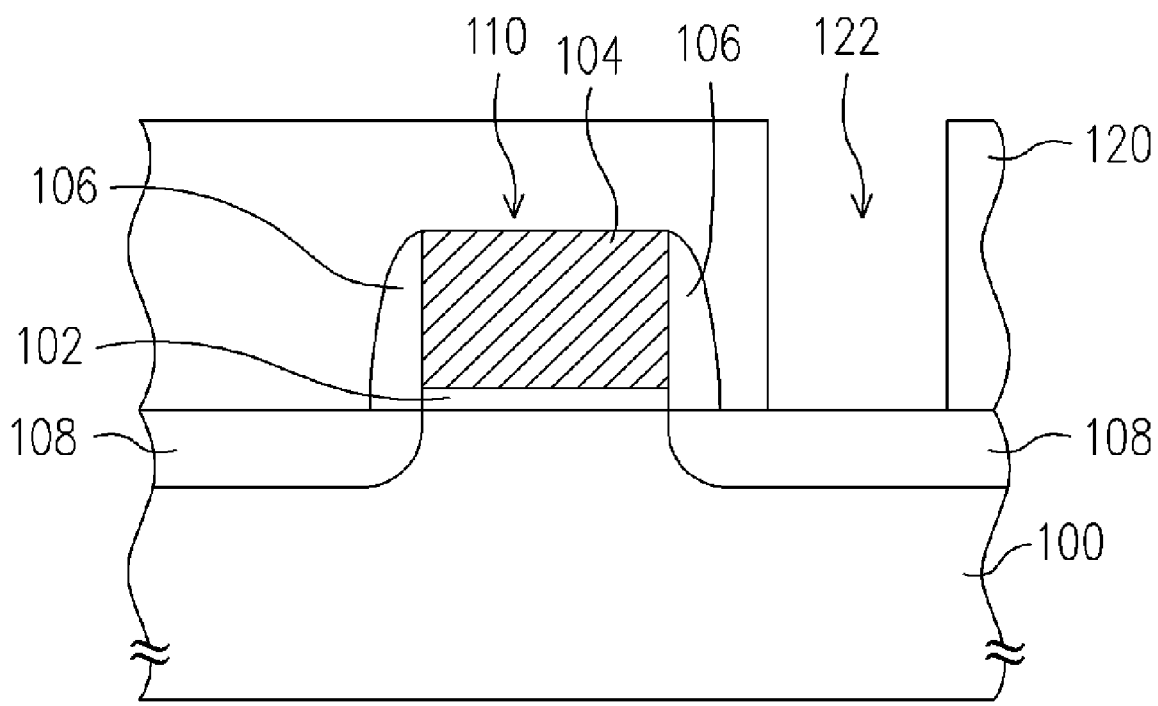
Figure 2:
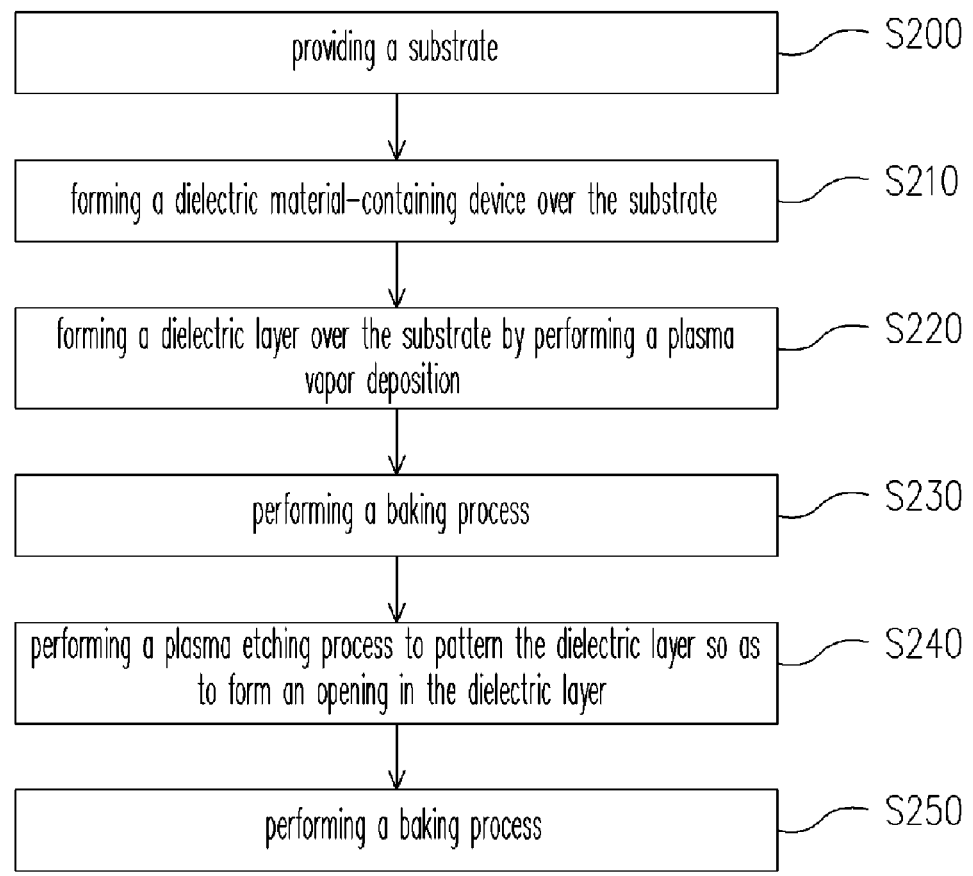
FIG. 2 is a flow chart illustrating a method for manufacturing a semiconductor device according to a preferred embodiment of the invention.

FIGS. 1A through 1C are cross-sectional views illustrating a method for manufacturing a semiconductor device according to a preferred embodiment of the invention. FIG. 2 is a flow chart illustrating a method for manufacturing a semiconductor device according to a preferred embodiment of the invention.

As shown in FIG. 1A and FIG. 2, in the step S200, a substrate 100 is provided. The substrate 100 can be, for example but not limited to, a semiconductor substrate. Preferably, the substrate 100 is a silicon substrate.

Then, in the step S210, a dielectric material-containing device 110 is formed on the substrate 100. In this embodiment, the dielectric material-containing device 110 can be, for example but not limited to, a metal-oxide semiconductor transistor 110. When the dielectric material-containing device 110 is a metal-oxide semiconductor transistor, the dielectric material-containing device 110 comprises a gate dielectric layer 102, a gate electrode 104, a spacer 106 and a source/drain region 108. The gate dielectric layer 102 can be, for example but not limited to, made of silicon oxide or other proper material. The gate electrode 104 can be, for example but not limited to, made of polysilicon or other proper material. The spacer 106 can be, for example but not limited to, made of silicon oxide or other proper material. The source/drain region 108 can be, for example but not limited to, formed by implanting dopants with P conductive type or N conductive type into the substrate 100.

In one embodiment, the dielectric material-containing device 110 can be, for example but not limited to, a SONOS memory, a flash memory or a capacitor.

Moreover, as shown in FIG. 1B and FIG. 2, in the step S220, a dielectric layer 120 is formed over the dielectric material-containing device 110 to cover the dielectric material-containing device 110. The dielectric layer 120 can be, for example but not limited to, an inter-layer dielectric layer. In one embodiment, the dielectric layer 120 can be, for example but not limited to, an iner-metal dielectric layer. The dielectric layer 120 can be formed by performing a plasma vapor deposition process. The plasma vapor deposition process can be, for example but not limited to, a plasma enhanced chemical vapor deposition process or a high density plasma chemical vapor deposition process.

During the plasma deposition process, it is common to accumulate particles within the dielectric material-containing device 110, especially in the gate dielectric layer 102. Therefore, the problem of the increasing of the surface voltage of the gate dielectric layer 102 happens. Furthermore, if the plasma deposition process is interrupted because the tool for performing the plasma deposition process is down or is abnormal shutdown, the particle accumulation within the dielectric material-containing device 110 is getting serious.

Additionally, in the step S230, a baking process is performed on the dielectric layer 120. The baking process can be performed more than once. The timing for performing the baking process can be the time right after the plasma vapor deposition process is interrupted. Also, the baking process can be performed right after the plasma vapor deposition process for forming the dielectric layer 120 is accomplished. Further, even though the plasma vapor deposition process is not interrupted, the baking process can be performed right after the plasma vapor deposition process is accomplished. The gas used in the baking process can be selected from a group consisting of inert gas, nitrogen, oxygen and $N_2O$. The inert gas can be helium, neon, krypton, xenon or radon. During the baking process is performed, the wafer is placed in an environment full filled with aforementioned gases. The temperature for performing the baking process is about 380~450 centigrade. Moreover, the baking process is performed for about 1~20 minutes.

Figure 3:
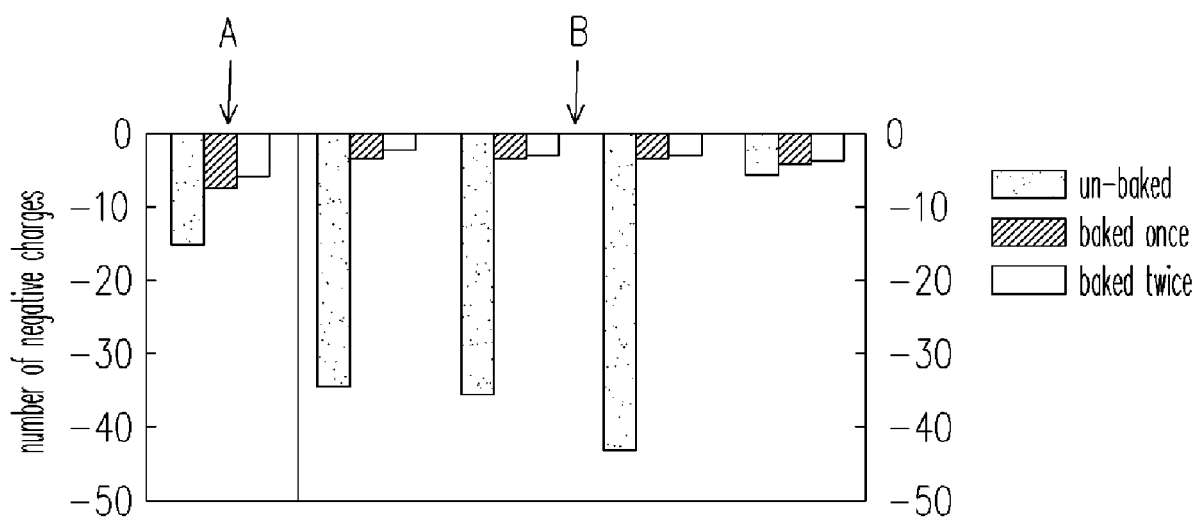
FIGS. 3 through 5 are bar charts showing experimental data of the dielectric layer formed by using the conventional manufacturing process and the method according to the embodiment of the present invention.
Figure 4:
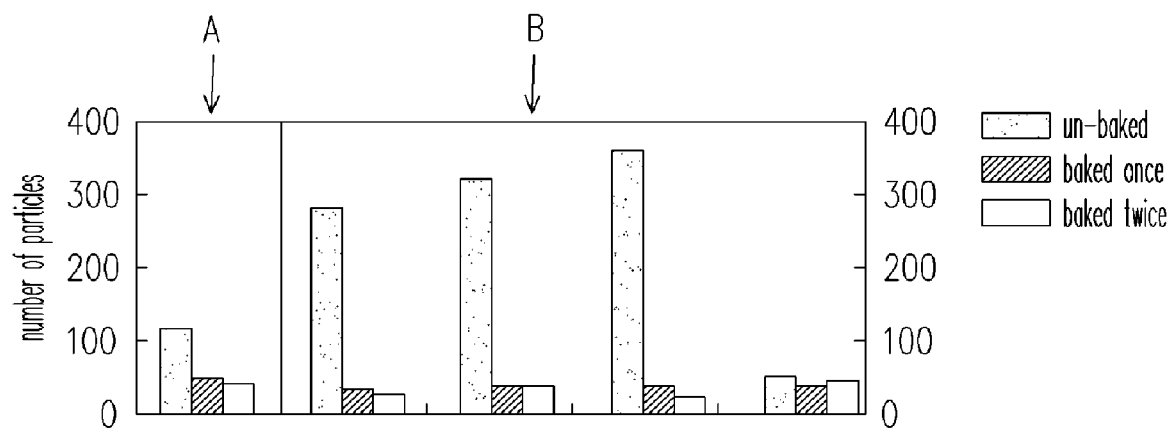
Figure 5:
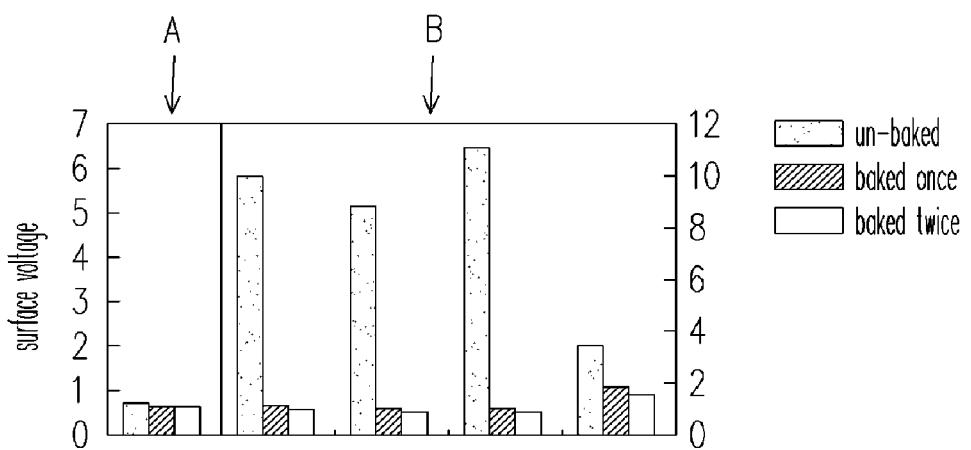

The baking process can decrease the number of the negative charges, the number of particles and the surface voltage of the gate dielectric layer 102 (as the experimental data shown in FIGS. 3 through 5). Hence, the yield and the reliability of the semiconductor device are increased. In another embodiment, when the dielectric material-containing device 110 is an SONOS memory, the baking process can improve the electrical property of the tunneling dielectric layer. Also, in the other embodiment, when the dielectric material-containing device 110 is a flash memory, the baking process can improve the electrical properties of the tunneling dielectric layer and the dielectric layer between the floating gate and the control gate. Furthermore, in an embodiment, when the dielectric material-containing device is a capacitor, the baking process can improve the electrical property of the dielectric layer between the top electrode and the bottom electrode.

FIGS. 3 through 5 are bar charts showing experimental data of the dielectric layer formed by using the conventional manufacturing process and the method according to the embodiment of the present invention. In FIGS. 3 through 5, the doted bars represent the experimental data of the gate dielectric layer made by the manufacturing process without performing the baking process. The bars with slashes represent the experimental data of the gate dielectric layer made by the manufacturing process with performing the baking process once. The blank bars represent the experimental data of the gate dielectric layer made by the manufacturing process with performing the baking process twice. Furthermore, the experimental data in the region labeled A respectively indicated in the FIGS. 3 through 5 show that the gate dielectric layer is made under a circumstance that the plasma deposition process for forming the gate dielectric layer is performed normally. On the other hand, the experimental data in the region labeled B respectively indicated in the FIGS. 3 through 5 show that the gate dielectric layer is made under a circumstance that the plasma deposition process procedure for forming the gate dielectric layer is interrupted. As for the regions B in FIGS. 3 through 5 respectively, when the plasma deposition process is interrupted while the tool for performing the plasma deposition process is down or is abnormal shutdown, the number of the negative charges, the number of the particles and the surface voltage of the gate dielectric layer are dramatically increased. However, by comparing the experimental data from the region A with that from the region B, the number of the negative charges, the number of the particles and the surface voltage of the gate dielectric layer are decreased by performing the baking process in the manufacturing process for forming the gate dielectric layer no matter whether the plasma deposition process is interrupted.

The present invention can be applied to a plasma etching process. The below description follows the manufacturing procedure in the aforementioned embodiment to further illustrate the application of the present invention on the plasma etching process mentioned above.

As shown in FIG. 1C and FIG. 2, in the step S240, a patterned photoresist layer (not shown) is formed over the dielectric layer 120. A plasma etching process is performed to pattern the dielectric layer 120 to form an opening 122 in the dielectric layer 120 by using the patterned photoresist layer as a mask. In the present embodiment, when the dielectric material-containing device 110 is a metal-oxide semiconductor device, the opening 122 can be a contact window opening. In another embodiment, the opening 122 can be, for example but not limited to, a via opening, a trench or a capacitor opening.

Moreover, in the step S250, a baking process is performed on the dielectric layer 120. The baking process can be performed more than once. The timing for performing the baking process can be the time right after the plasma etching process is interrupted. Also, the baking process can be performed right after the plasma etching process for patterning the dielectric layer 120 is accomplished. Further, even though the plasma etching process is not interrupted, the baking process can be performed right after the plasma etching process is accomplished. The gas used in the baking process can be selected from a group consisting of inert gas, nitrogen, oxygen and $N_2O$. The inert gas can be helium, neon, krypton, xenon or radon. During the baking process is performed, the wafer is placed in an environment full filled with aforementioned gases. The temperature for performing the baking process is about 380~450 centigrade. Moreover, the baking process is performed for about 1~20 minutes.

In the embodiment, the plasma etching process affects the electrical property of the dielectric layer 102 within the dielectric material-containing device, such as the metal-oxide semiconductor device. In another embodiment, the plasma etching process affects the electrical properties of the tunneling dielectric layer of the SONOS memory, the tunneling dielectric layer between the floating gate and the controlling gate in the flash memory and the dielectric layer between the top electrode and the bottom electrode of the capacitor. By performing the baking process after the plasma etching process is interrupted or accomplished, the electrical properties can be improved.

Hence, in the process for manufacturing the semiconductor device, the baking process can be used as a remedy process for the interruption of the plasma process, such as the plasma deposition process or the plasma etching process. Also, the baking process can be brought into the standard manufacturing process after the plasma process is performed to remove the accumulated particles within the dielectric material-containing device so as to decrease the surface voltage of the dielectric layer and to improve the dielectric property of the dielectric material layer. Therefore, the yield and the reliability of the device are increased.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for manufacturing semiconductor device, comprising:
   providing a substrate;
   forming a dielectric material-containing device over the substrate;
   performing a plasma vapor deposition process to form a dielectric layer over the substrate; and
   performing a first baking process after the plasma vapor deposition process is interrupted.

2. The method of claim 1, wherein the dielectric material-containing device is selected from a group consisting of a metal-oxide semiconductor, an SONOS memory, a flash memory and a capacitor.

3. The method of claim 1, wherein the dielectric layer is an inter-layer dielectric layer or an inter-metal dielectric layer.

4. The method of claim 1, wherein the plasma vapor deposition process is selected from a group consisting of a plasma enhanced chemical vapor deposition process and a high density plasma chemical vapor deposition.

5. The method of claim 1 further comprising a step of performing a second baking process after the plasma vapor deposition process is accomplished.

6. The method of claim 1, wherein the first baking process is performed right after the plasma vapor deposition process is performed.

7. The method of claim 1, wherein a gas used in the first baking process is selected from a group consisting of inert gas, nitrogen, oxygen and $N_2O$.

8. The method of claim 7, wherein the inert gas is selected from a group consisting helium, neon, krypton, xenon and radon.

9. The method of claim 1, wherein the first baking process is performed under a temperature of about 380~450 centigrade.

10. The method of claim 1, wherein the first baking process is performed for about 1~20 minutes.

11. A method for manufacturing a semiconductor device, comprising:
providing a substrate;
forming a dielectric material-containing device over the substrate;
forming a dielectric layer over the substrate;
performing a plasma etching process to pattern the dielectric layer to form an opening in the dielectric layer; and
performing a first baking process after the plasma etching process is interrupted.

12. The method of claim 11, wherein the dielectric material-containing device is selected from a group consisting of a metal-oxide semiconductor, an SONOS memory, a flash memory and a capacitor.

13. The method of claim 11 further comprising a step of performing a second baking process after the plasma etching process is accomplished.

14. The method of claim 11, wherein the first baking process is performed right after the plasma etching process is performed.

15. The method of claim 11, wherein a gas used in the first baking process is selected from a group consisting of inert gas, nitrogen, oxygen and $N_2O$.

16. The method of claim 15, wherein the inert gas is selected from a group consisting helium, neon, krypton, xenon and radon.

17. The method of claim 11, wherein the first baking process is performed under a temperature of about 380~450 centigrade.

18. The method of claim 11, wherein the first baking process is performed for about 1~20 minutes.

19. The method of claim 11, wherein the opening is selected from a group consisting of a contact window opening, a via opening, a trench and a capacitor opening.

20. The method of claim 11, wherein the dielectric layer is an inter-layer dielectric layer or an inter-metal dielectric layer.

21. The method of claim 11, wherein the dielectric layer is formed by performing a plasma vapor deposition process.

22. The method of claim 21, the plasma vapor deposition process is selected from a group consisting of a plasma enhanced chemical vapor deposition process and a high density plasma chemical vapor deposition.

23. The method of claim 21 further comprising a step of performing a third baking process after the dielectric layer is formed.

24. The method of claim 23, wherein the third baking process is performed right after the plasma vapor deposition process is performed.

25. The method of claim 23, wherein the third baking process is performed after the plasma vapor deposition process is interrupted.

26. The method of claim 23, wherein the third baking process is performed under a temperature of about 380~450 centigrade.

27. The method of claim 23, wherein the third baking process is performed for about 1~20 minutes.

* * * * *